United States Patent [19]

Toda et al.

[11] Patent Number: 5,587,963

[45] Date of Patent: *Dec. 24, 1996

[54] SEMICONDUCTOR MEMORY DEVICE

[75] Inventors: Haruki Toda; Shozo Saito; Kaoru Tokushige, all of Yokohama, Japan

[73] Assignee: Kabushiki Kaisha Toshiba, Kawasaki, Japan

[*] Notice: The term of this patent shall not extend beyond the expiration date of Pat. No. 5,313,437.

[21] Appl. No.: 427,270

[22] Filed: Apr. 24, 1995

Related U.S. Application Data

[62] Division of Ser. No. 223,222, Apr. 5, 1994, Pat. No. 5,500,824, which is a division of Ser. No. 775,602, Oct. 15, 1991, Pat. No. 5,313,437.

[30] Foreign Application Priority Data

Oct. 15, 1990 [JP] Japan ................................ 2-273170
Oct. 2, 1991 [JP] Japan ................................ 3-255354

[51] Int. Cl.⁶ .................... G11C 7/00; G11C 14/00
[52] U.S. Cl. .................. 365/236; 365/233; 365/230.03; 365/230.01
[58] Field of Search ................... 365/230.01, 230.03, 365/233, 236, 189.01

[56] References Cited

U.S. PATENT DOCUMENTS

| | | | |
|---|---|---|---|
| 4,330,852 | 5/1982 | Redwine et al. | 365/221 |
| 4,819,213 | 4/1989 | Yamaguchi et al. | 365/233 |
| 4,849,937 | 7/1989 | Yoshimoto | 365/189.05 |
| 4,956,820 | 9/1990 | Hashimoto | 365/233 |
| 5,054,000 | 10/1991 | Miyaji | 365/230.03 |
| 5,058,074 | 10/1991 | Sakamoto | 365/236 |
| 5,235,545 | 8/1993 | McLaury | 365/230.08 |
| 5,268,865 | 12/1993 | Takasugi | 365/189.05 |
| 5,295,115 | 3/1994 | Furuya et al. | 365/230.08 |
| 5,305,277 | 4/1994 | Derwin et al. | 365/230.02 |
| 5,313,437 | 5/1994 | Toda et al. | 365/236 |
| 5,323,358 | 6/1994 | Toda et al. | 365/230.09 |
| 5,341,341 | 8/1994 | Fukuzo | 365/230.08 |
| 5,343,438 | 8/1994 | Choi et al. | 365/233 |
| 5,390,149 | 2/1995 | Vogley et al. | 365/189.01 |

FOREIGN PATENT DOCUMENTS

| | | |
|---|---|---|
| 0211565 | 2/1987 | European Pat. Off. . |
| 0260897 | 3/1988 | European Pat. Off. . |
| 0284985 | 10/1988 | European Pat. Off. . |
| 0315194 | 5/1989 | European Pat. Off. . |
| 63-272191 | 11/1988 | Japan . |
| 5-2873 | 1/1993 | Japan . |

OTHER PUBLICATIONS

Ohno, Chikai, "Self–Timed RAM: STRAM", *Fujitsu Sci. Tech J.*, 24, 4, Dec. 1988, pp. 293–300.

Dunn, E. C. et al., "Single Counter Controlled Buffer", *IBM Technical Disclosure Bulletin*, vol. 20, No. 5, Oct. 1977, pp. 1702–1703.

*Primary Examiner*—Viet Q. Nguyen
*Attorney, Agent, or Firm*—Foley & Lardner

[57] ABSTRACT

A semiconductor memory device includes a memory cell having a plurality of memory cells arranged in rows and columns, the memory cells storing data and being selected according to address signals. The device also includes a control unit to receive a clock signal and a first control, or trigger, signal for outputting a plurality of the data in synchronism with the clock signal after the first control signal is asserted. The output of the data begins a number of clock cycles (N) of the clock signal (N being a positive integer≧2) after the first control signal is asserted, a different one of the data being output at each of the clock cycles after the output begins until the plurality of data is output.

25 Claims, 18 Drawing Sheets

FIG. 2A BASIC CLOCK SIGNAL CLK

FIG. 2B CHIP ENABLE SIGNAL $\overline{CE}$

FIG. 2C Add

FIG. 2D $D_{OUT/IN}$

FIG.12A
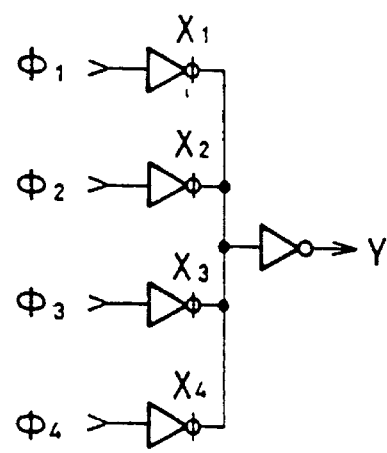
FIG.12B
| Y | $X_1$ | $X_2$ | $X_3$ | $X_4$ |
|---|---|---|---|---|
| $\Phi_A$ | A | B | C | D |
| $\Phi_B$ | D | A | B | C |
| $\Phi_C$ | C | D | A | B |
| $\Phi_D$ | B | C | D | A |
FIG.13A
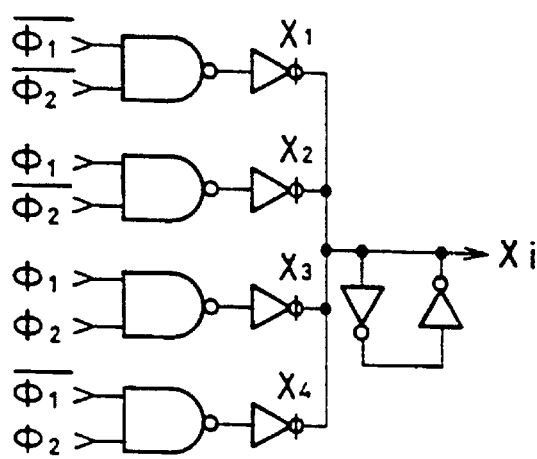
FIG.13B
| $X_i$ | $X_1$ | $X_2$ | $X_3$ | $X_4$ |
|---|---|---|---|---|
| A | $\alpha$ | $\beta$ | $\gamma$ | $\delta$ |
| B | $\delta$ | $\alpha$ | $\beta$ | $\gamma$ |
| C | $\gamma$ | $\delta$ | $\alpha$ | $\beta$ |
| D | $\beta$ | $\gamma$ | $\delta$ | $\alpha$ |

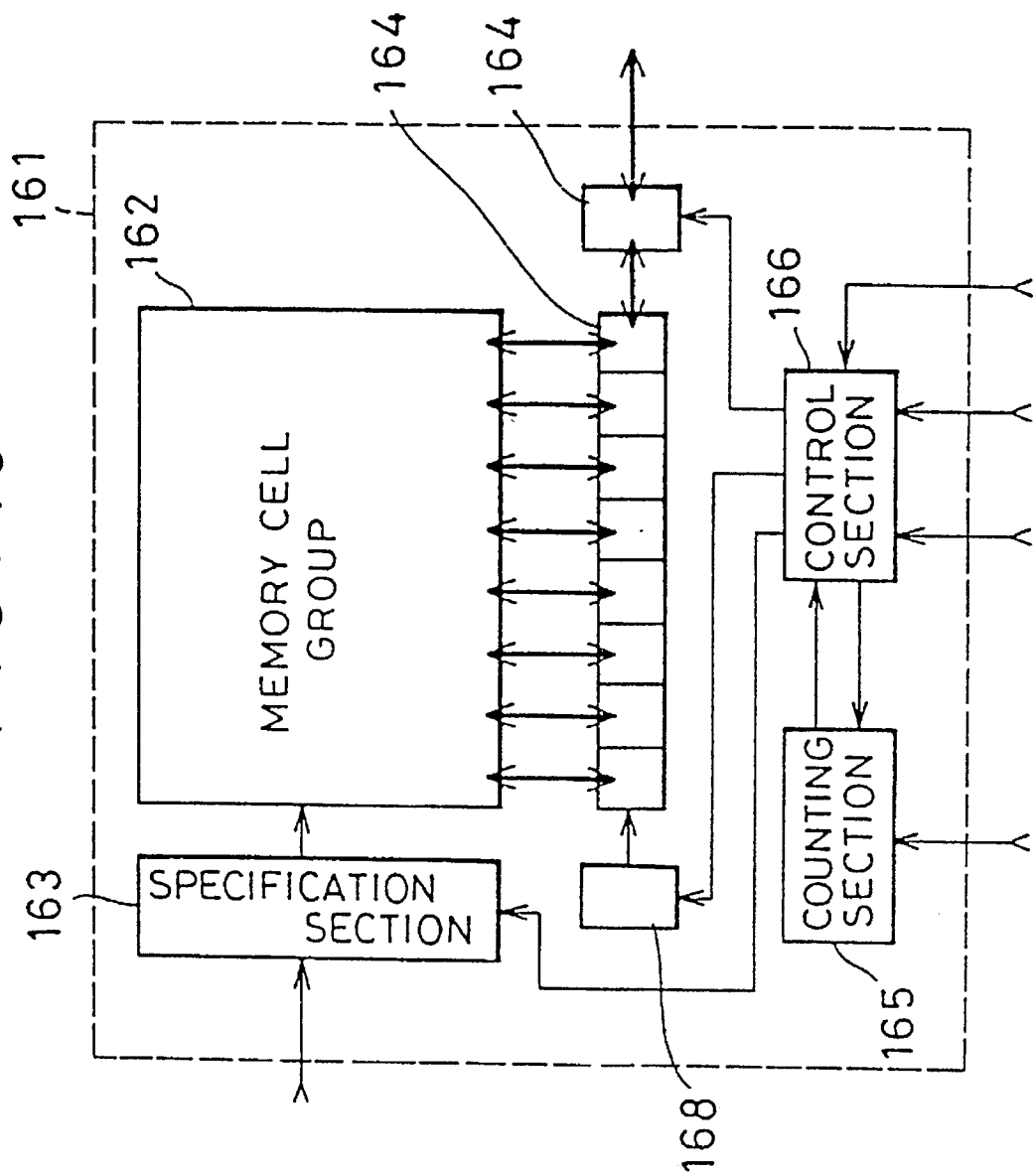

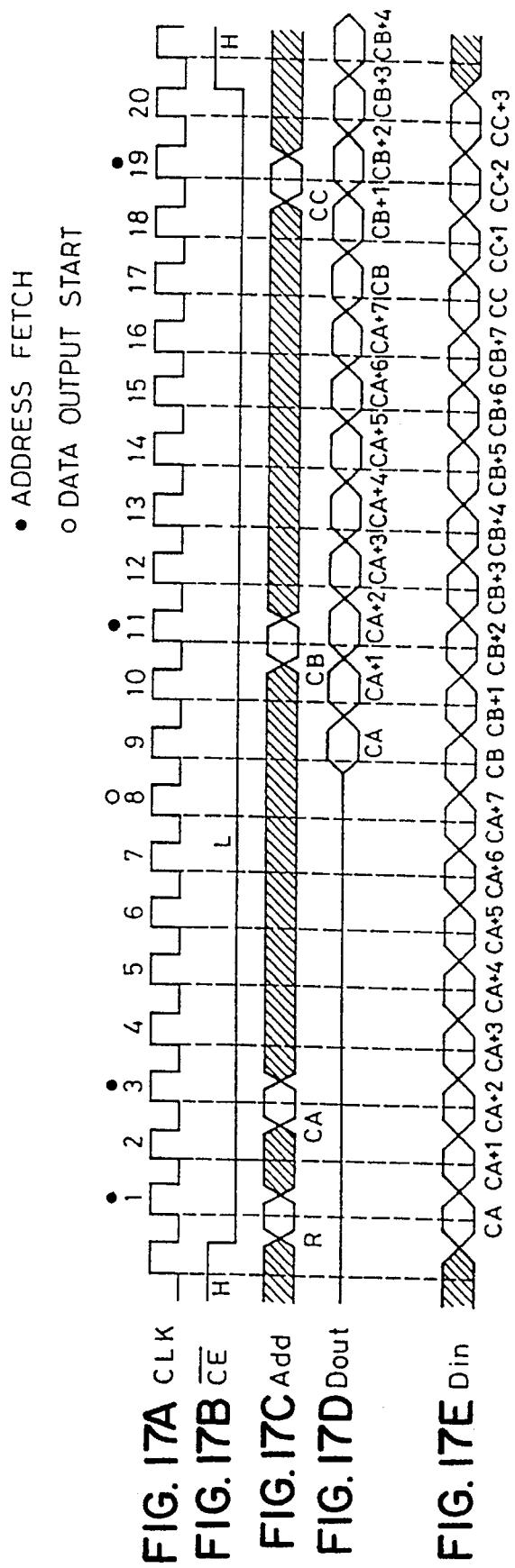

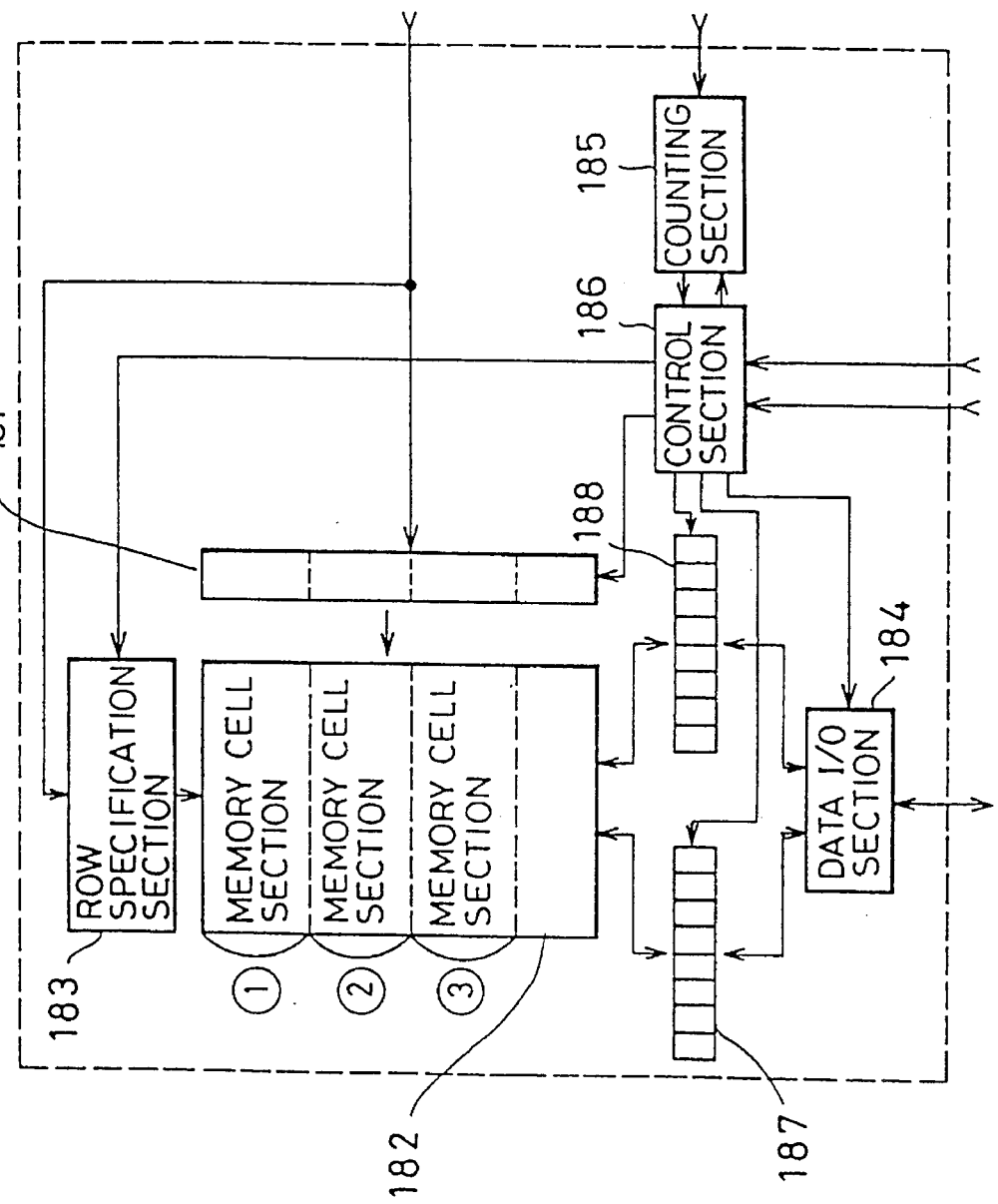

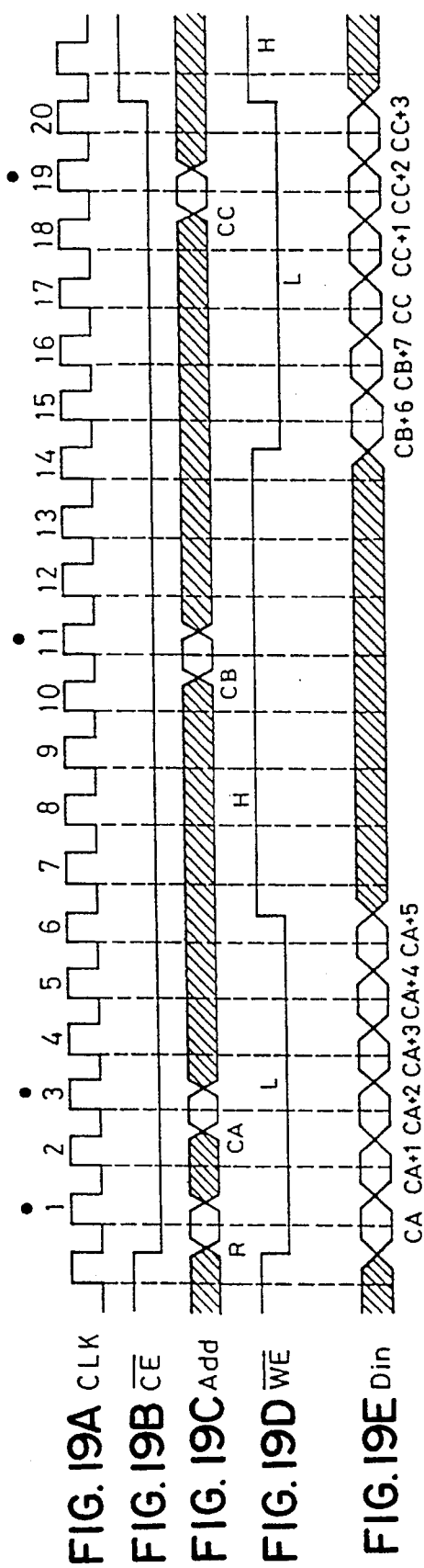

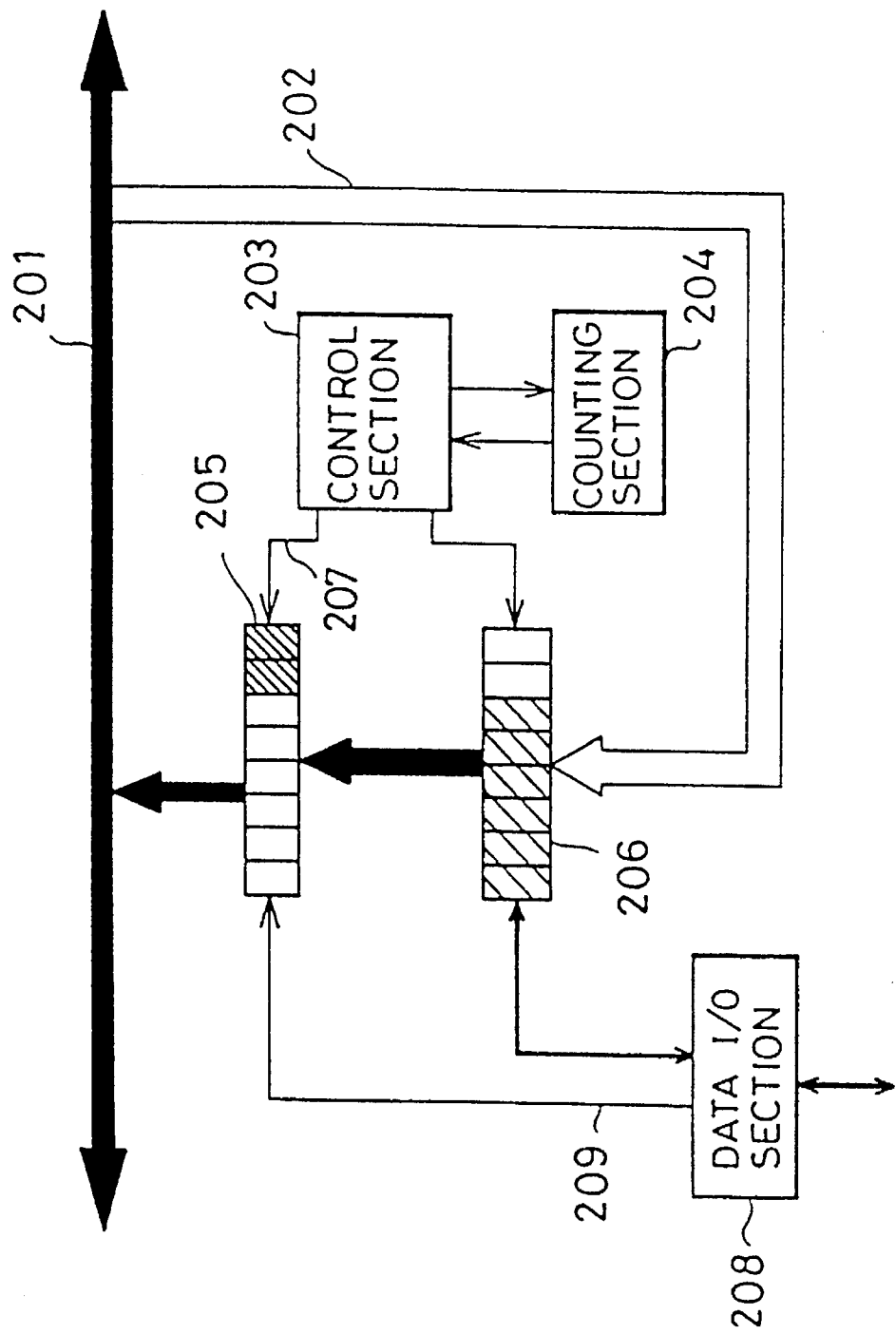

SEMICONDUCTOR MEMORY DEVICE

This application is a divisional of application Ser. No. 08/223,222, now U.S. Pat. No. 5,500,824 filed Apr. 5, 1994, which is a divisional of application Ser. No. 07/775,602, filed Oct. 15, 1991, now U.S. Pat. No. 5,313,437.

BACKGROUND OF THE INVENTION

1. Field of the Invention

The present invention relates to a semiconductor memory device comprising a plurality of easily-controllable memory cells which can be accessed at high speed.

2. Description of the Prior Art

A conventional, standard, general-purpose DRAM has a page mode for access at a high speed cycle time. As is commonly known, in this page mode it is possible to access specified memory cells in a row of a memory cell array selected by means of a row address, by arbitrarily changing a column address in a string of simultaneously sensed memory cells.

High speed access is possible with this type of mode for the following reasons. Considerable time is required for sense amplification of the cell data in a DRAM, but once the data has been sensed, the read-out of this data proceeds very quickly. Once a column address has been changed in the page mode operation, the access to the sense amplifier which has sensed that cell is commenced and the data is output when a CAS signal is switched to "L." Accordingly, the page mode is a random access mode.

Recently, the capacity of memory chips has been increasing year after year. Accordingly, the number of chips used in a system has been reduced. Therefore, when large volume chips are used in the prior art, namely when many chips are used in a system, these chips are divided into a number of groups which are interleaved, making it possible to construct and utilize a memory system in which the apparent cycle time is short, but this method cannot be used in a system having small volume chips.

On the other hand, the speed of MPUs have been increasing year after year, and even in a small scale system there is a necessity to achieve high speeds. For these reasons, it has become necessary for a memory to operate at even higher cycle speeds. Also, from these requirements it is not absolutely necessary for the access operation to be random; there are many cases in which all that is required is the ability to read or write a string of data at high speed.

A method for providing a high speed operation for RAM including SRAM and the like has been reported in the following literature.

Chikai Ohno, "Self-Timed RAM: STRAM", FUJITSU Sci. tech. J., 24, 4, pp 293–300, Dec. 1988.

In the literature, the following method is disclosed. A RAM (STRAM) operates in synchronization with a system clock, namely in the RAM, an address signal and R/W signals for a read-out or for write-in are received in synchronization with the clock signal at a timing, then at the next timing a content of the memory cell addressed by the address signal is output.

However, in this method the address signal must be provided at every cycle of the system clock. Therefore, there is a disadvantage that the access operation to a memory cell in the RAM cannot be followed by the period of the system clock when the period becomes high.

When a conventional page mode is used, an address change is absolutely necessary. Therefore, it is impossible to operate with a higher access cycle time which is more than the time needed by the address control of the system. Speed increases for the memory access operation are therefore limited.

Control signals such as RAS signals and CAS signals must be supplied to the memory chip. These control signals are produced by the system. Accordingly, the control for supplying the control signals to the memory chip is an obstacle to providing a high speed operation with a memory system which includes an access means. In this case, the operation control of the system becomes so complex that it is difficult to use the control of the system.

SUMMARY OF THE INVENTION

An object of the present invention is to provide, with due consideration to the drawbacks of such conventional devices, a semiconductor memory device provided with an easily-controllable dynamic memory which can be accessed at high speed.

Access by the semiconductor device of the present invention commences with an internal operation synchronized with a basic clock signal which is input at an almost continuous, fixed frequency. After the address is obtained, the operation which determines "read-out" or "write-in", begins after a certain cycle number of fixed cycles which are basic clock cycles, input at an almost fixed frequency. The operation is controlled by a specifying signal for specifying a cycle which acts as the starting point for counting these cycles.

A first type semiconductor memory device according to the first embodiment of the present invention, comprises:

a memory cell group comprising a plurality of memory cells arranged in matrix;

specification means for specifying sequentially memory cells addressed by consecutive addresses in the memory cells, and for entering them in an active state;

data input/output (I/O) means for performing a data read-out/write-in operation (data I/O operation) for the consecutive memory cells specified by the specification means under a control based on a read-out/write-in signal provided from an external section;

count means for counting the number of cycles of a basic clock signal provided from an external section; and control means for receiving at least one or more specification signals provided from an external section, for outputting a control signal per specification signal for specifying a particular cycle as a starting cycle to count the number of the cycles of the basic clock signal, and for instructing the count means to count the number of counts of the basic clock signal based on the control signal, and for controlling a specification operation executed by the specification means and the data I/O operation of the data I/O means, so that the memory access operations for the memory cell group are controlled.

A second type semiconductor memory device according to the second embodiment of the present invention, comprises:

a memory cell group comprising a plurality of memory cells grouped into a plurality of cell blocks arranged in matrix;

selection means for outputting a selection signal provided based on a basic clock signal provided consecutively from an external section and an address signal for specifying an address of the cell block in order to select and activate the cell block by interleaving consecutively the memory cell blocks;

specification means for specifying sequentially and activating the memory cells addressed by consecutive addresses in the memory cell block in accordance with the address signal and the selection signal for activating and enterring the cell block in an active state by the selection means;

data input/output (I/O) means for performing a data read-out/write-in operation (data I/O operation) for the consecutive memory cells specified by the specification means under a control based on a read-out/write-in signal provided from an external section:

count means for counting the number of cycles of the basic clock signal provided from an external section; and control means for receiving at least one or more specification signals provided from an external section, for outputting a control signal per specification signal for specifying a particular cycle as a starting cycle to count the number of the cycles of the basic clock signal, and for instructing the count means to count the number of counts of the basic clock signal based on the control signal, and for controlling a selection and activation operation executed by the selection means, a specification operation executed by the specification means and the data I/O operation executed by the data I/O means, so that by which the memory access operations for the memory cell group are controlled.

A third type semiconductor memory device according to the third embodiment of the present invention, comprises:

a memory cell group comprising a plurality of memory cells arranged in matrix;

specification means for specifying and activating at once a fixed number of the memory cells, as a package memory cell, addressed by consecutive addresses in the memory cells in accordance with a basic clock signal and an address signal provided from an external section;

store means for storing temporarily data from or to the fixed number of the memory cells specified at once by the specification means;

control means for carrying at once a data transfer operation between the fixed number of the memory cells specified at once by the specification means and the store means in accordance with the basic clock signal and the specification signal;

data Input/output (I/O) means for executing sequentially a data read-out/write-in operation (data I/O operation) for the store means in accordance with the basic clock signal: and count means for counting the number of cycles of a basic clock signal, wherein the control means receives at least one or more specification signals provided from an external section, outputs a control signal per specification signal for specifying a particular cycle as a starting cycle to count the number of the cycles of the basic clock signal, instructs the count means to count the number counts of the basic clock signal based on the control signal, controls a specification operation executed by the specification means and the data I/O operation of the data I/O means based on the number of the cycles including the number of the cycles at least two or more counted from the particular cycle by the count means, and so that the control means controls the memory access operations for the memory cell group.

These and other objects, features and advantages of the present invention will be more apparent from the following description of preferred embodiments, taken in conjunction with the accompanying drawings

BRIEF DESCRIPTION OF THE DRAWINGS

FIGS. 10, 11, 12A, 12B, 13A, 13B, and 14 are configuration diagrams showing circuits which produce various types of cycles of clock signals;

FIG. 16 is a block diagram of a semiconductor memory device as a third embodiment according to the present invention;

FIG. 17 is a timing chart showing an I/O operation of the semiconductor memory device shown in FIG. 16;

FIG. 18 is a block diagram of a semiconductor memory device as a fourth embodiment according to the present invention;

FIG. 19 is a timing chart showing an I/O operation of the semiconductor memory device shown in FIG. 18; and FIG. 20 is a block diagram of a semiconductor memory device as a fifth embodiment according to the present invention.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Figure 1:
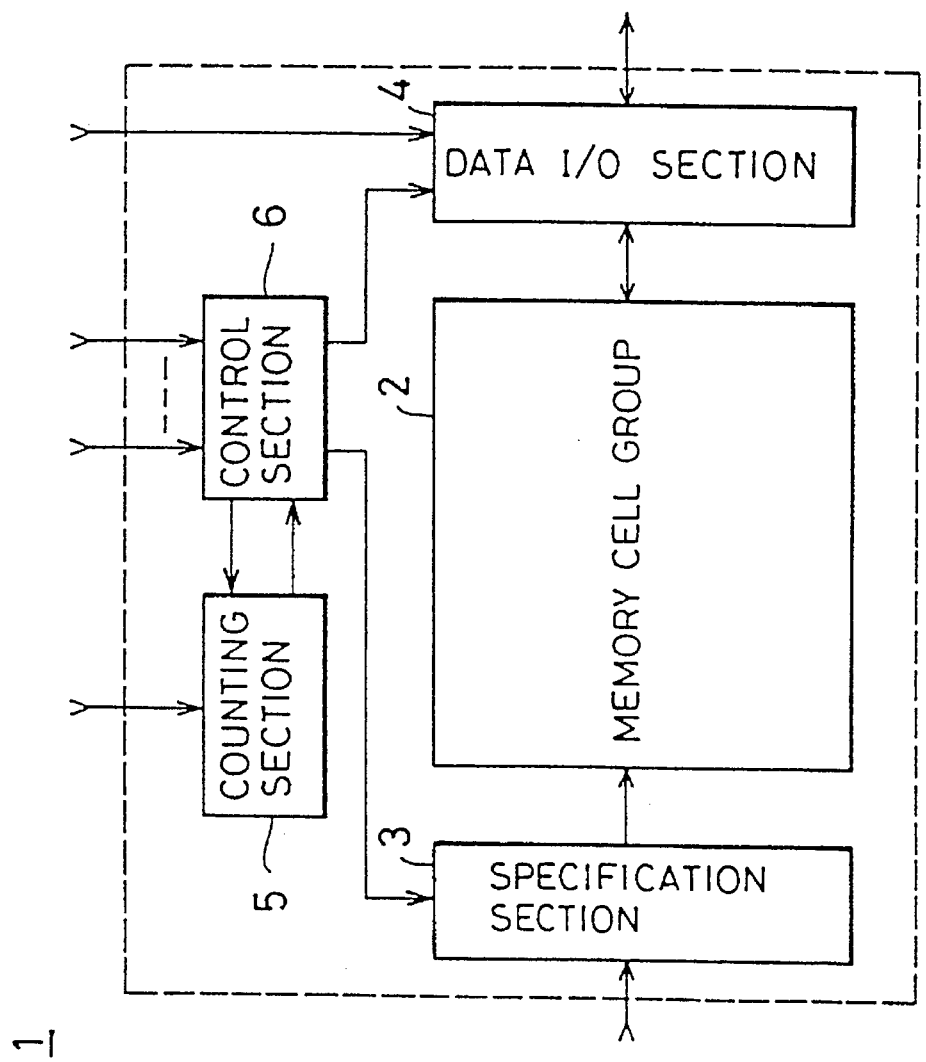
FIG. 1 is a block diagram of a semiconductor memory device as a first embodiment according to the present invention.

FIG. 1 is a configuration drawing showing the essential parts of a first embodiment of the semiconductor memory device of the present invention. The memory device illustrated in the drawing uses a dynamic memory cell, a static memory cell, or a non-volatile memory cell. In this memory device, control of the internal circuit operations is based on the number of cycles of a continuous external clock signal, to perform the memory access operation.

As shown in FIG. 1, a memory device 1 comprises a memory cell group 2 provided with a normal memory device, a specification section 3, and a data I/O section 4, to which are added a counting section 5 and a control section 6, which are the main structural elements for performing the operation which is the special feature of the present invention.

The dynamic memory cell, the static memory cell, or the non-volatile memory cell of the memory cell group 2 is arranged in the form of a matrix. The data which is written in and read out is stored in this memory cell. The specification section 3 allots consecutive addresses in the memory cell group 2 according to a series of externally-provided address signals, and designates, in order, the memory cells which are to be accessed. The specification section 3, for example, fetches a row address signal, then fetches a series of column address signals for a string of memory cells designated by the row address signal. The specification section 3 designates a series of memory cells consecutively by means of the column address signal.

The data I/O section 4 performs a read or write operation on a memory cell designated by the specification section 3 based on a read/write signal obtained externally. The read-out data is output to an external destination through the data I/O section 4. The data to be stored is provided to the designated memory cell from an external source through the data I/O section 4 by the specification section 3.

The counting section 5 is a counter for counting the number of cycles of a basic clock signal CLK continuously input at an almost fixed frequency from an external source.

The counter 5 is capable of counting a fixed number of clock cycles of the basic signal CLK and discriminating some clock cycles from other cycles. A circuit essentially having the function can be considered as the counter 5. Therefore a circuit having the function described above can be used instead of the counter 5 when there is the circuit in the semiconductor memory device.

The external basic clock signal CLK used in this embodiment is a clock signal with a cycle time of, for example, less than the 30 ns access time of the memory device. The counting section 5 provides the control section 6 with the count of the number of cycles of the clock signal CLK.

The control section 6 receives a specification signal which is provided from an external source and stipulates the conditions for the memory device, for example, a $\overline{CE}$ (chip enable) signal or an $\overline{OE}$ (output enable) signal, for specifying a particular cycle of the clock signal CLK by means of a level transition, designates the particular cycle of the clock signal CLK for each signal, and, in addition, initiates the count of the clock signals CLK in the counting section 5. The control section 6, based on the number of cycles of the clock signal CLK counted by the counting section 5, controls the fetching of the address signal in the specification section 3 and the internal I/O operation of the data in the data I/O section 4, and the like.

Next, the operation of the device shown in FIG. 1 will be explained using timing charts shown in FIG. 2 to FIG. 5.

Figure 2:
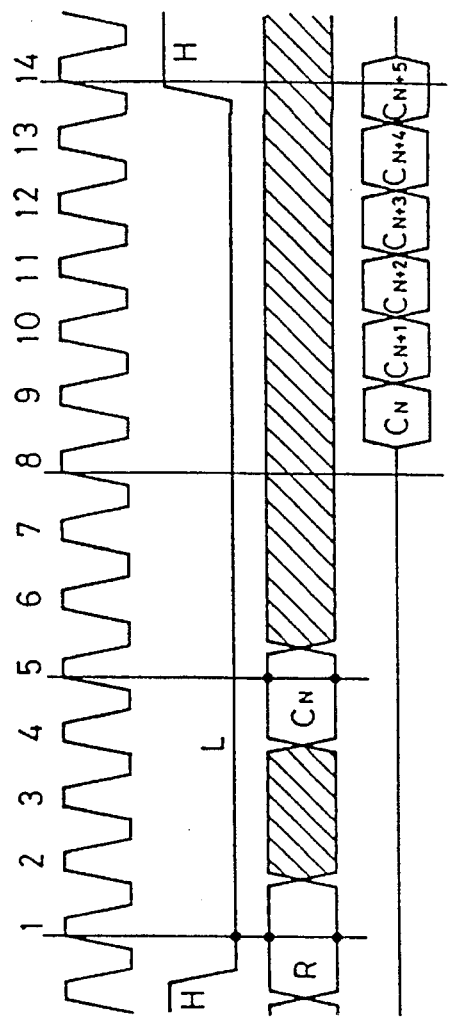
FIG. 2 is a timing chart showing an I/O operation of the semiconductor memory device shown in FIG. 1.

FIG. 2 is a diagram showing one example of the timing chart of an operation I/O signal for the memory device shown in FIG. 1. In FIG. 2, a signal CLK is a clock signal with a cycle time of 30 ns or less for continuous input and output, which is provided into the counting section 5.

A signal $\overline{CE}$ is a signal which indicates the active period of the memory device 1. The operation of the memory device 1 is controlled by means of the value of the signal CLK during the period when a signal $\overline{CE}$ is at the "L" level. In FIG. 2, the signal CE enters the "L" level, and the value of an address signal Add is fetched as a row address R to the specification section 3 at the rise of the initial clock signal CLK (CYCLE 1). Following this, the value of the address signal Add at the rise of the clock signal CLK of the fifth CLK cycle (CYCLE 5) is fetched to the specification section 3 as a column address CN. The data of the column address CN is output to the data I/O section 4 from the eighth active clock cycle (CYCLE 8) which is the third clock signal after the column address CN has been fetched.

According to the progress of the clock signals 9, 10, 11, ..., the data from a previously decided order of addresses CN+1, CN+2, CN+3 ..., is output serially to the data I/O section 4. When the CE signal is switched to the "H" level, a fixed number of clock cycles is ignored after the signal $\overline{CE}$ enters the "H" cycle on the rise of the clock signal CLK, and the memory enters the inactive state. In FIG. 2, the rise of the clock signal CLK occurs following the 14th clock cycle (CYCLE 14).

Figure 3:
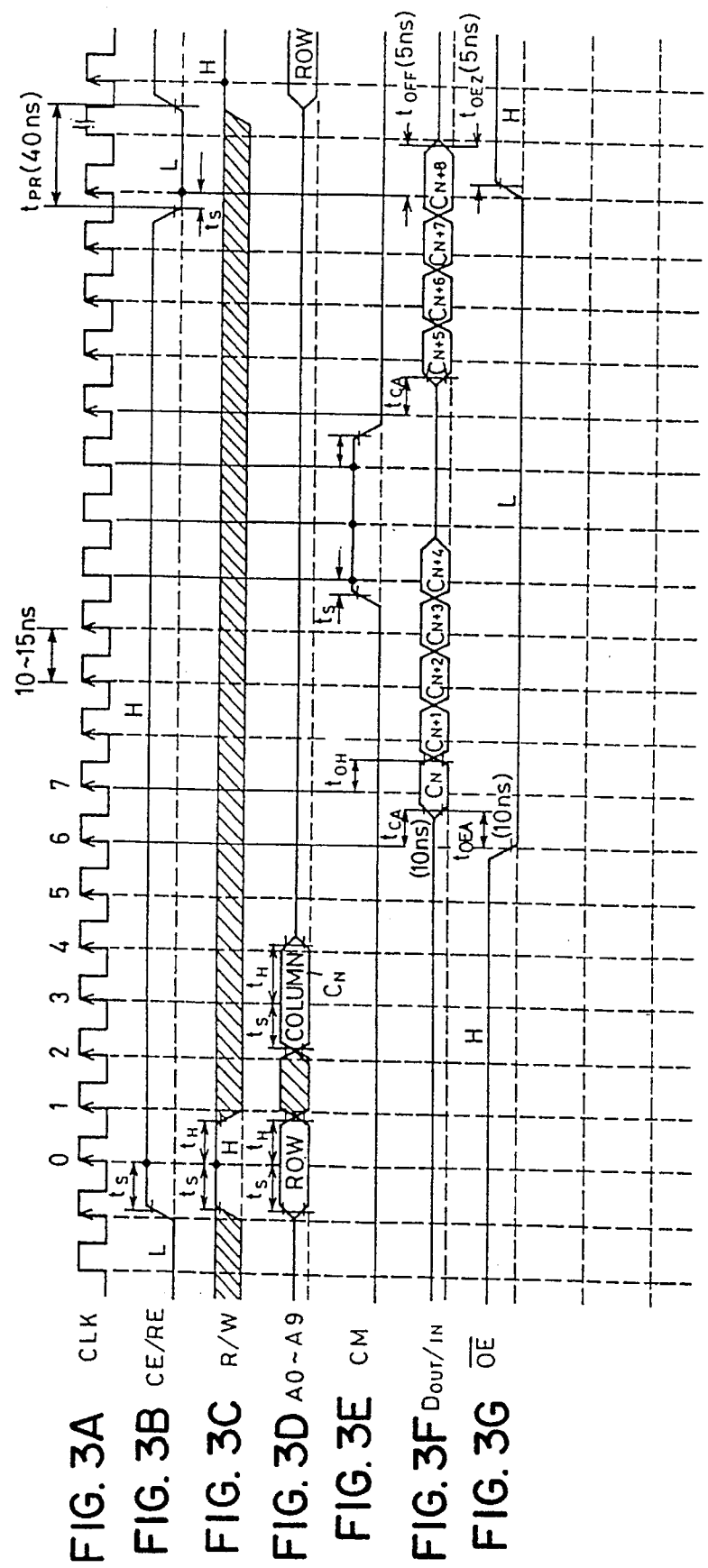
FIGS. 3 to 5 are timing charts showing I/O operations based on various I/O control methods for the semiconductor memory device shown in FIG. 1.
Figure 4:
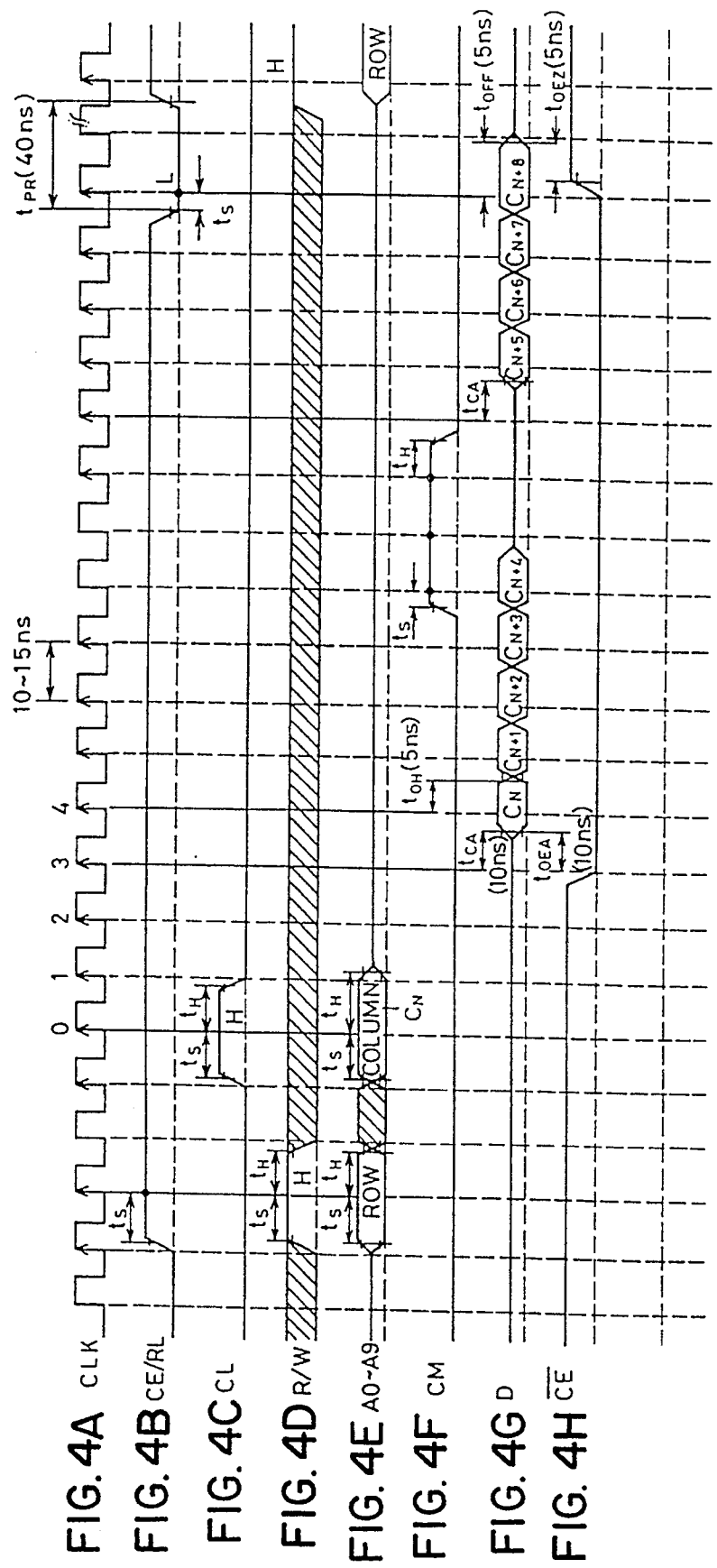
Figure 5:
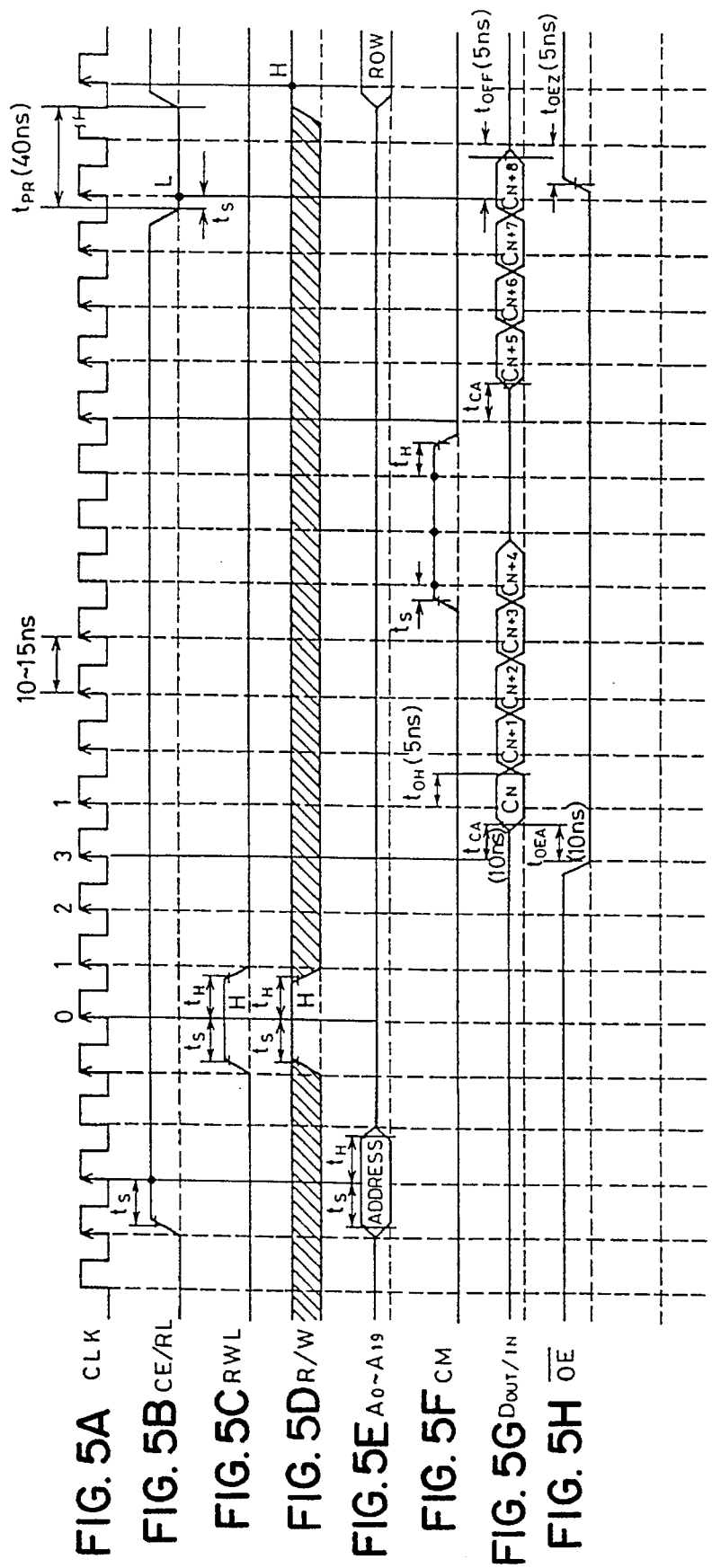

Several variations have been considered in a control method for this type of memory. Examples of these variations will be illustrated. In FIG. 3 to FIG. 5, specific examples of timing waveforms are shown. In addition, representative values of stipulated timing periods are also shown simultaneously in FIG. 3 to FIG. 5.

A CE/RL signal in FIG. 3 to FIG. 5 corresponds to the $\overline{CE}$ signal in FIG. 2. However, the $\overline{CE}$ signal is based on the negative logic and the CE/RL signal on the positive logic. The logic of the $\overline{CE}$ signal differ from the logic of the CE/RL signal.

An R/W signal provides instructions as to whether or not the memory operates for a read-out or for a write-in. A0 to A9 (shown in FIGS. 3 and 4) and A0 to A19 (shown in FIG. 5) are address signals. A signal CM indicates that the memory does not receiving a clock signal while the CM signal is "H".

$D_{OUT/IN}$ indicates data read out of an accessed memory cell or data written into that memory cell.

An $\overline{OE}$ signal is a control signal. When the $\overline{OE}$ signal is "L", data is output in $D_{OUT/IN}$, and when "H", the memory output related to $D_{OUT/IN}$ is in a high impedance state.

FIG. 3 is a diagram showing the specific fetch timing of an R/W signal for a read out instruction, in addition to the case in FIG. 2. in FIG. 3, the column address is fetched to the specification section 3 at the clock signal designated by the CLK ③, and the memory cell data begins to be output to the data I/O section 4 at the clock signal denoted by the CLK ⑥.

FIG. 4 is a timing chart in the case where a clock cycle in which the column address is fetched can be indicated by a clock signal independent of the timing for fetching the row address. In FIG. 4, after the row address is fetched to the specification section 3, if a CL signal enters the "H" level when the clock signal rises, the column address is fetched to the specification section 3 during that clock cycle, and access to the cell commences. During this fetch cycle, the data following the column addresses CN, CN+1, CN+2, CN+3, CN+4 from the clock cycle (CLK 3) shown in FIG. 4, which is a fixed number of cycles, is output in serial order.

FIG. 5 is a timing chart of I/O operations for the memory device in which the R/W signal is controlled based on level change of a RWL signal. This figure shows the timing chart in the case where the clock signal which fetches the address can be independently and freely set. This is the case where the address is fetched without being divided into row and column parts (specifically, the address is not multiplexed). In FIG. 5, if the RWL signal is at the "H" level at the rise of the clock signal CLK, the R/W signal, which determines whether there is a read out or a write in from the clock cycle, is fetched. The output of data starts at the CLK 3 which follows the above-mentioned cycle by a fixed number of cycles. Read-outs are shown in the above three timing examples in FIG. 8 to FIG. 5, but it is also possible to perform a write operation by setting the R/W signal. In such a case, external data is input to the memory from $D_{OUT/In}$.

In addition, many combinations of control operation methods are also possible in the above examples. For example, it is possible to combine the RWL signal and the CL signal as one signal. It is also possible to fetch the column address and the R/W signal simultaneously, fetch the row address, column address, and the R/W signal independently, and to commence the read/write operation at the cycle following a fixed number of clock signals which has become the final fetch cycle.

In addition, instead of the method mentioned above, it is possible to fetch the external signals such as the R/W signal and the like, during a fixed period between cycles, for example between the M-th cycle and the N-th cycle. It goes without saying that the same data read/write operation can also be continued during a fixed period between cycles.

Figure 6:
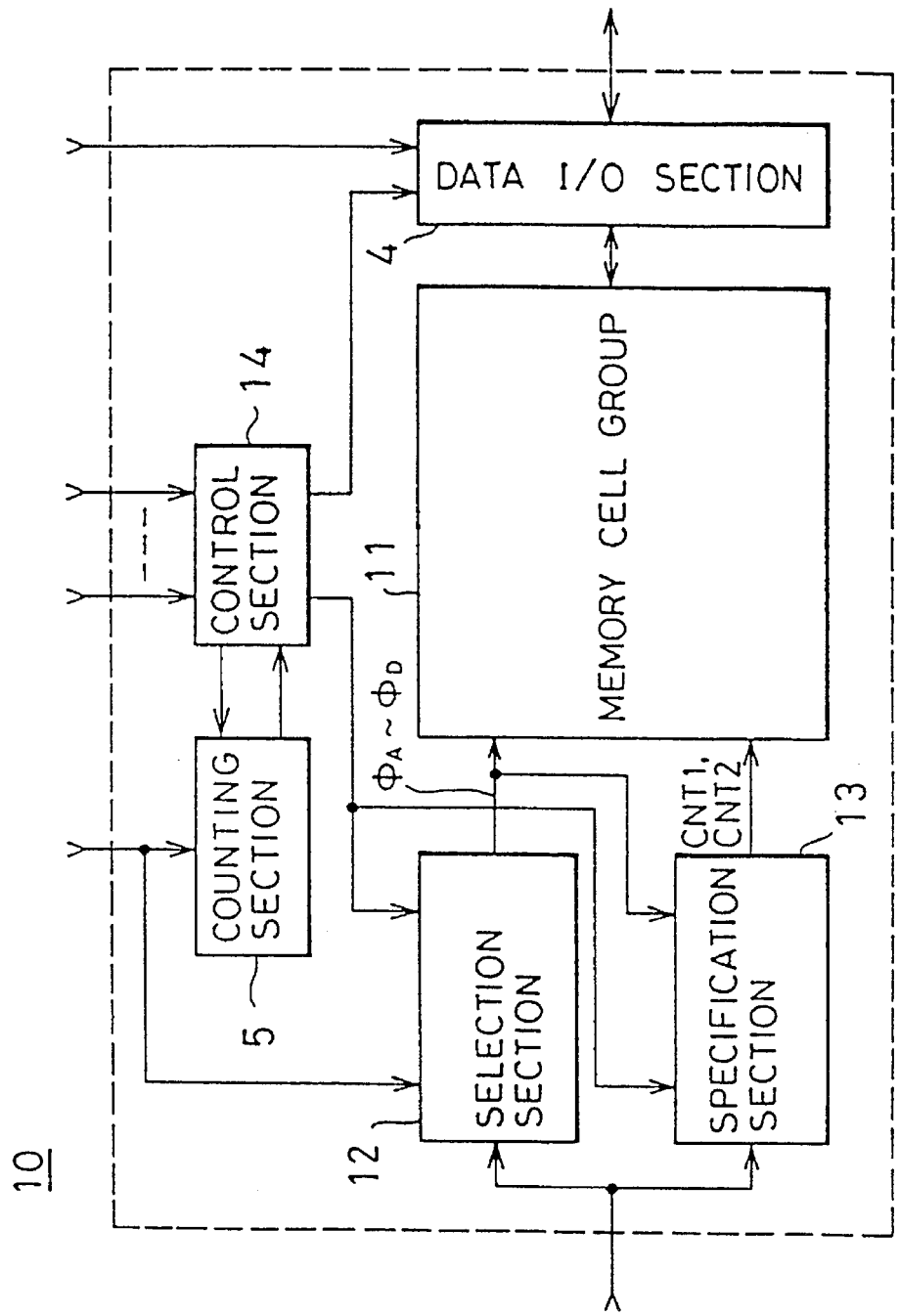
FIG. 6 is a block diagram of a semiconductor memory device as a second embodiment according to the present invention.

In FIG. 6, the control method in the first embodiment described above is applied to an interleaved type of memory device according to a second embodiment of the present invention. This diagram shows the main configuration of a memory device for which the above-mentioned control method functions effectively.

In FIG. 6, a memory device 10 comprises a memory cell group 11, a selection section 12, a specification section 13, and a control section 4.

The functions of components in FIG. 6 which bear the same reference numbers as components in FIG. 1 have the same functions as those components. Further explanation is therefore omitted here. In the memory cell group 11, for example, a dynamic type memory cell is formed as a block and arranged in matrix form. This memory cell also includes a column decoder. An example of a specific configuration of the memory cell group 11 will be later described. The selection section 12 is based on one part of an external basic clock signal and an address signal. The respective blocks of the memory cell in the memory cell group 11 are interleaved, and consecutive selection is activated.

The selection section 12 provides a series of selection activation signals ΦA, ΦB, ΦC, and ΦD to the memory cell group 11. The specification section specifies the row address based on an address signal, and specifies the column address of the selectively activated block, based on a signal which is one part of the address signal and one part of the selection activation signals.

Specific examples of the configuration of the selection section 12 and the specification section 13 will be later described. The control section 14 controls the operations of the selection section 12 and the specification section 13 based on the number of cycles of an external basic clock signal.

Figure 7:
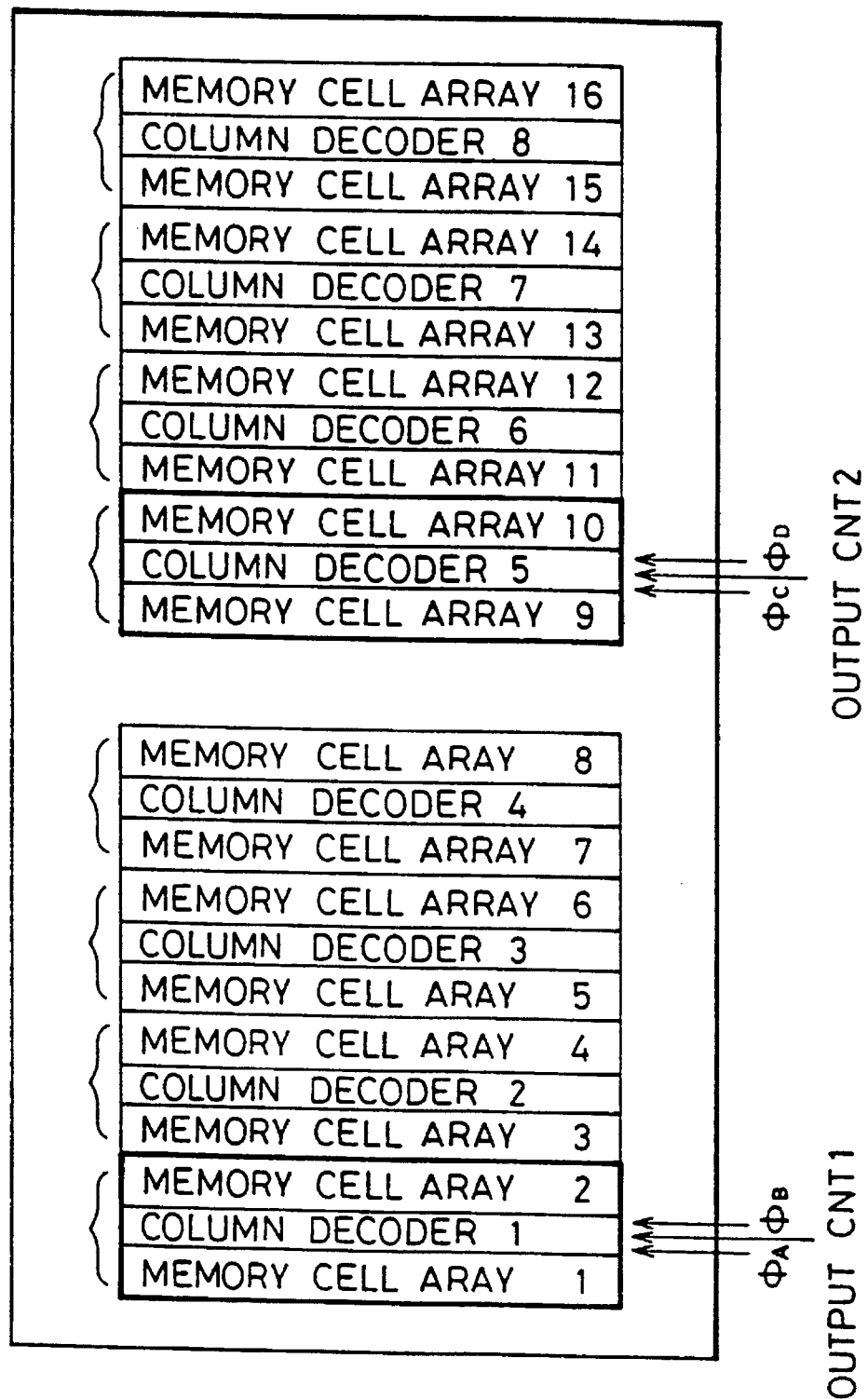
FIG. 7 is a diagram showing an arrangement of a cell array mat of memory cell groups as a part in the semiconductor memory device shown in FIG. 6.

FIG. 7 is a diagram showing the arrangement of a memory cell array mat (a memory cell array) of the memory cell group 11. In FIG. 7, the memory cell comprises a total of 16 memory cell array mats. A plurality of column decoders takes up eight columns, each column decoder being interposed between two memory cell array mats. This memory system performs four separate operations. When a certain row address is selected, for example, the cell array mats 1, 2, 9, and 10 enclosed in the heavy lines in FIG. 7 are activated. Specifically, one fourth of the memory cell group 11 corresponding to row addresses are activated. In FIG. 7 there are four combinations of parts of the memory cell array mats, (1, 2, 9, 10) (3, 4, 11, 12) (5, 6, 13, 14) and (7, 8, 15, 16).

FIG. 7 shows the conditions under which the first combination (1, 2, 9, 10) is activated. Part of the memory cells which are activated simultaneously, as shown in the example in FIG. 7, are divided into equal part cell array blocks, and serial access is carried out in the order predetermined for this array.

The example of FIG. 7 is divided into four cell blocks, and this selection is performed by means of the selection activation signals ΦA, ΦB, ΦC, and ΦD.

In the example shown in FIG. 7, the cell array mat corresponds to the cell array block one to one.

In addition, the column direction access is serial. Accordingly, the input to the column decoder is the output from the serial counter. Because the memory arrays 1, 2, 9, and 10 are interleaved in serial order and accessed, the counter output from the serial counter, which is input to the column decoders 1 and 5, is also interleaved. This interleaving operation will be later explained.

Figure 8:
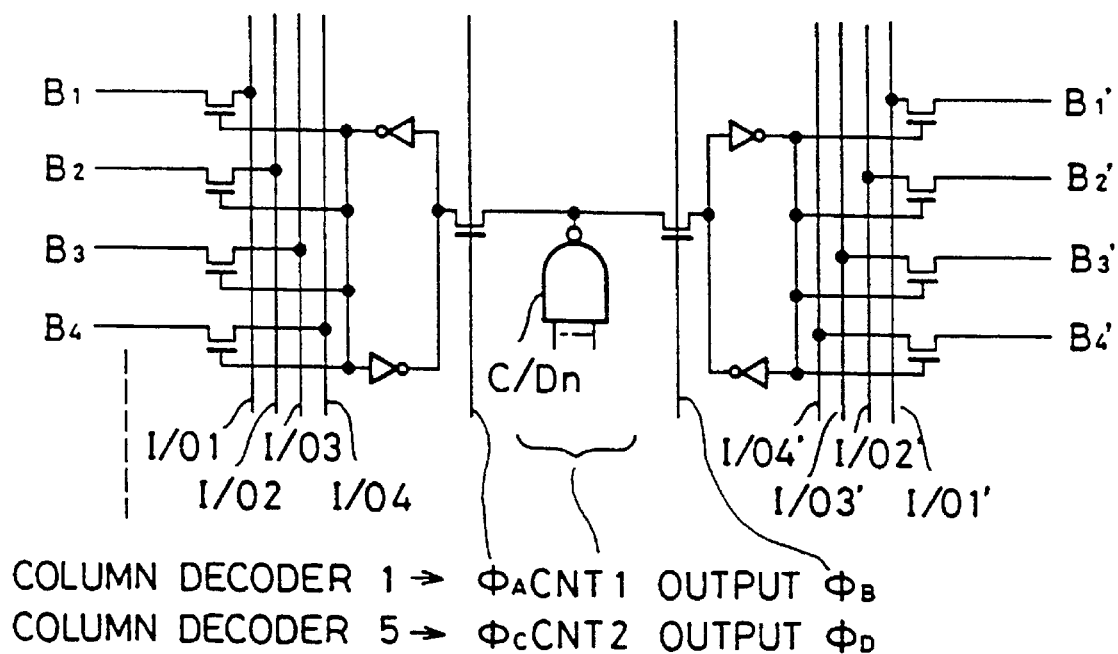
FIG. 8 is a circuit diagram of a column decoder incorporated into the semiconductor device shown in FIG. 6.

FIG. 8 shows a specific example of one configuration of a column decoder used in the semiconductor memory device shown in FIG. 6. The configuration of the column decoder shown in FIG. 8, shows parts of the column decoders 1, 5 from FIG. 7 combined. In addition, the $D_{OUT/IN}$ shown in FIG. 2 to FIG. 5 is assumed to be an I/O of four bits, and the data transmission routes linked to this input/output circuit are shown as I/O1 to I/O4. In addition, a bit line constructed from a complementary signal pair, and the above-mentioned I/O line are shown as one line for simplicity.

In FIG. 8, a column decoder C/Dn formed from a NAND gate is selected by means of serial counter output. Subsequently, when the decoder output is at the "L" level and the signal ΦA rises, the bit lines B1 to B4 are connected to the I/O lines, and data access begins. This is a latch circuit so this selection state is maintained even when the signal ΦA enters the "L" level and is maintained until the signal ΦA next rises.

Next, when the signal ΦB rises, the bit lines B1' to B4' are connected to the I/O lines I/O1' to I/O4'. In this manner, data items are transmitted consecutively from the memory arrays 1, 2, 9, 10 by the consecutive rising of the signals ΦA, ΦB, ΦC, ΦD. In addition, the data can be written in through the I/O lines in the reverse manner.

Figure 9:
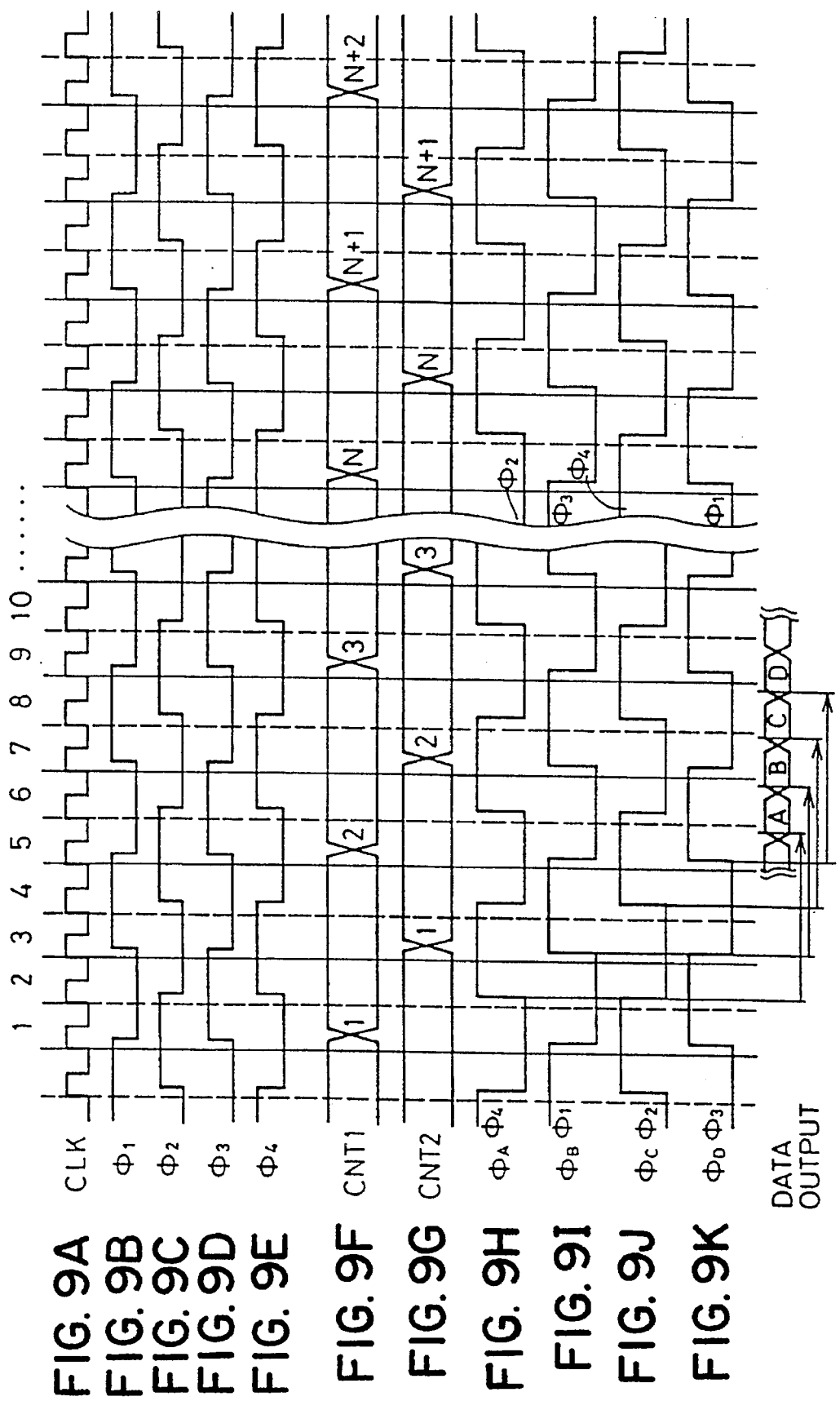
FIG. 9 is a timing chart showing an I/O operation of the semiconductor memory device shown in FIG. 6.

Accordingly, if the signals ΦA, ΦB, ΦC, ΦD are interleaved, the clock signal can utilize three cycles from the initiation of access until the output of the data, as illustrated in the lower portion of the timing waveforms of FIG. 9. Accordingly, the data can be output at three times the speed set by the circuit operation. In addition, because three cycles elapse until the same memory cell array can be accessed once again, the data received from an external source can be transmitted at a high speed cycle for a write-in, in the same manner as for a read-out.

FIG. 9 shows the timing chart for the internal signals with interleaving operation, illustrating the case where interleaving based on four phases of the clock signals is adopted. In FIG. 9, an external clock signal CLK is divided into four times the number of cycles, and the internal basic clock signals Φ1, Φ2, Φ3, Φ4 which are out of phase with the external clock signal by one cycle are generated by the selection section 12. These clock signals are suitably selected and the signals ΦA, ΦB, ΦC, ΦD are generated. The method of selection will be later explained.

A signal CNT1 and a signal CNT2 show the output from the serial counter which is input to the column decoders 1 and 5 shown in FIG. 7. The signal CNT1 is carried out first by a count up operation using a four cycle clock signal. A two-cycle delay signal CNT2 is then counted up in the same manner. This state is indicated in FIG. 9 by numbers attached to the waveforms of the signal CNT1 and the signal CNT2. Next, the method of selecting the array will be explained in chronological order.

In FIG. 9, in a certain cycle of the clock signal 1, for example CLK 1, the output of the signal CNT1 changes, and the C/Dn of the column decoder 1 is selected. In a next cycle CLK 2, the memory cell array 1 side shown in FIG. 7 is connected to the I/O line from the rise of the signal ΦA. With a next cycle CLK 3, the memory cell array 2 side is connected to the I/O' line from the rise of the signal ΦB. In this cycle, the output of the signal CNT2 simultaneously changes, and becomes the same as the output of the signal CNT1. As a result, the C/Dn of the column decoder 5 is selected.

In the following cycle CLK 4, the selection state of the memory cell array 1 is latched by the latch circuit at the drop in the signal ΦA. This state is maintained even if the state of the column decoder C/Dn changes. Also, the memory cell array 9 side is connected to the I/O line at the rise of the signal ΦC. This I/O line is, of course, a different line than that to which the column decoder 1 is connected. The signal ΦB drops in the next cycle CLK 5, the signal ΦD rises, and the count-up state of the output of the signal CNT1 is changed. As a result, the C/Dn of the column decoder 1 is in the non-selected state. However, the signal ΦA drops and the signal ΦB also drops so that no change occurs in the connection states of the I/O line and the I/O' line of the memory cell arrays 1, 2. Also, the memory array 10 side is connected to the I/O' line at the rise of the signal ΦD. This I/O' line is, of course, a different line than that to which the column decoder 1 is connected.

Then, in this cycle, the data transmitted to the I/O line of the column decoder I is output from the memory through the data I/O section 4. In the next cycle CLK 6, once again the signal ΦA rises and the signal ΦC drops. the bit lines B1 to B4 are disconnected from the I/O lines on the rise of the signal ΦA. This is because the output of the column decoder C/Dn is at the "H" level and the transmission transistors of the bit lines and the I/O lines enter the OFF state. Simultaneously, the output of the C/D of the other column decoders enters the "L" level. The bit lines on the memory cell array 1 side belonging to the column decoder C/D are connected to the I/O lines. In this cycle, the data transmitted to the I/O' line of the column decoder system 1 is output from the memory through the data I/O section 4. Further, the operation produced consecutively by the column decoder system 1 is also carried out in the column decoder system 5 by the fall of the signal ΦC. An explanation is therefore omitted. Next, the reasons why the system connecting the internal basic clock signals Φ1 to Φ4 with the clock signals ΦA to ΦD which actually drive the memory device cannot be a fixed connection will be explained, as will the connection logic.

Because the time at which the memory is activated is optional, the state of the internal basic clock signal is not fixed each time access commences. On the other hand, in the selection of the respective bit lines and of the column decoder C/D, it is necessary for the signals CNT1, CNT2, and the signals ΦA, ΦB, ΦC, ΦD to be fixed signals.

Accordingly, when the column address has been set and access started, the connection state of the basic clock signals and the signals ΦA, ΦB, ΦC, ΦD must be determined according to the state of the basic clock signals Φ1 to Φ4 and the address, and the signals ΦA, ΦB, ΦC, ΦD must start from the correct state. Specifically, it is necessary that the operation normally be carried out with a fixed inner operation phase relationship. In the section on the right side of FIG. 9, a connection which differs from the section on the left side is shown. In FIG. 9, the left side connection, as shown in the drawing, is Φ4 - ΦA, Φ1 - ΦB, Φ2 - ΦC, Φ3 - ΦD; on the right side Φ2 - ΦA, Φ3 - ΦB, Φ4 - ΦC, Φ1 - ΦD; and connection relationships exist for another two routes. In addtion, in FIG. 9, there are consecutive rising in the signal ΦA, but consecutive risings are also acceptable in those signals ΦB, ΦC, ΦD. These connection states are determined according to the states of the basic clock signals Φ1 to Φ4 at the clock cycle which starts the access to the column address.

Next an explanation will be given for specific configurations of the circuits which produce the above-described clock signals and the like.

Figure 10:
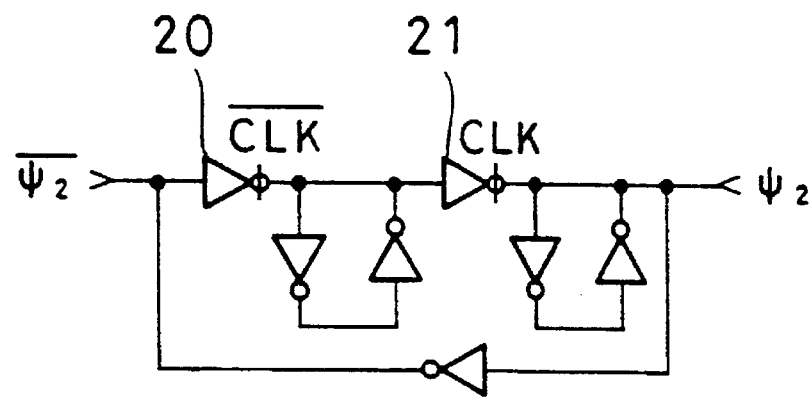

FIG. 10 is a configuration diagram showing a circuit which produces a double cycle of a clock signal φ2 from the external basic clock signal CLK.

In FIG. 10, a pair of clock inverters 20, 21 are illustrated. The clock inverter 21, for example, functions as an inverter when the clock signal is at the "H" level, and a high impedance output occurs at the "L" level. With the circuit configuration shown in FIG. 10, the state of the signal φ2 can be changed by switching the clock signal twice between "H" and "L".

Figure 11:
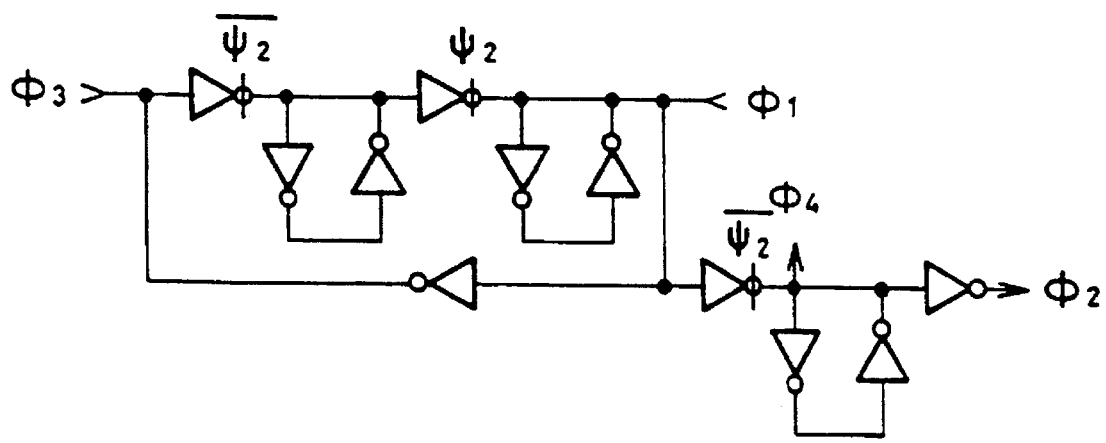

FIG. 11 is a configuration diagram showing a circuit which produces the basic clock signals Φ1, Φ2, Φ8, Φ4. The operation of the circuit shown in FIG. 11 is basically the same as that of the circuit shown in FIG. 10. However, in this circuit, the signal φ2 and the inverted signal φ2 are used in place of the clock signal and the inverted clock signal. Therefore, seen from the clock signals, a four-cycle clock signal is produced. The phase relationship of the signals Φ1, Φ2, Φ3, Φ4 is clear from the circuit configuration.

FIG. 12(a) is a configuration diagram showing a circuit which produces the actual circuit control clock signals Φ1, Φ2, Φ3, Φ4 from the internal basic clock signals.

In FIG. 12(a), the manner how to connect the four signals Φ1, Φ2, Φ3, Φ4 to the signals ΦA, ΦB, ΦC, ΦD is shown according to the values of a plurality of selection signals, X1 to X4. In this circuit, four output Ys actually exist, depending on the signals ΦA, ΦB, ΦC, ΦD.

FIG. 12(b) shows the relationship between the selection signals A, B, C, D, which are the signals X1 to X4, and the signals ΦA, ΦB, ΦC, ΦD which are the outputs Y. For example, when Y=ΦA, the circuits correspond to X1=A, X2 =B, X3=C, and X4=D. If the signal A is at the "H" level and the signals B to D are at the "L" level it can be understood from the combinations shown in FIG. 12(b) and the circuit configuration that the corresponding relationships become Φ1 - ΦA, Φ2 - ΦB, Φ8 - ΦC, Φ4 - ΦD.

FIG. 13(a) is a circuit which produces the signals A, B, C, D from the state of the basic clock signal Φ1, Φ2, Φ3, Φ4. As can be understood from FIG. 9, the signal Φ3 is the inverted phase of the signal Φ1, and the signal Φ4 is the inverted phase of the signal Φ2.

Therefore, the input of the circuit shown in FIG. 13(a) becomes the signals Φ1, Φ2, the invert signal Φ1, and the invert signal Φ2. All the sates of the basic clock signal are determined by four combinations of the states of the signals Φ1,Φ2. Four such circuits actually exist with the output XI depending on the signals A, B, C, and D. FIG. 13(b) shows the relationship between the selection signals α, β, γ, δ determined from the access head addresses which are the signals x1 to x4, and the signals A, B, C, and D which are the output X1. For example, the output Xi=A corresponds to the circuits for which x1=α, x2=βx3=γ, and x4=δ. From the state of the head addresses, when β is "H", α, γ, and δ are "L". If the state of the basic clock signal at this time is such that the signal Φ1 is at the "H" level and the signal Φ2 is at the "L" level, only the signal A becomes "H", from the combinations and circuit configuration show in FIG. 13(b).

Figure 14:
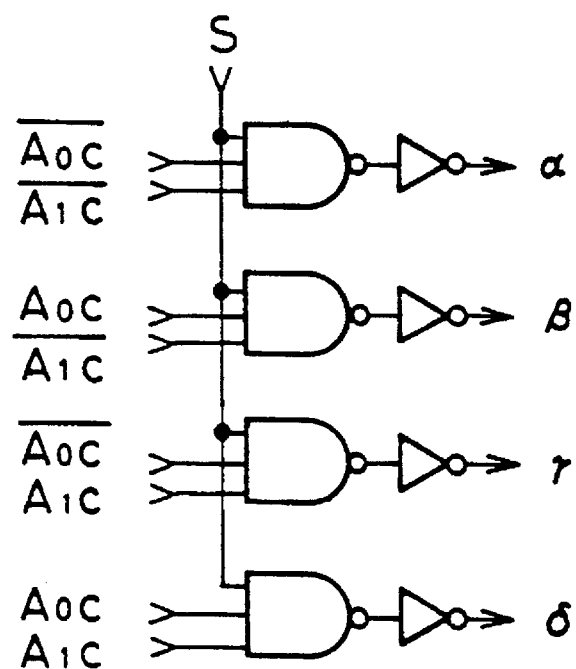

FIG. 14 shows a circuit configuration which produces the signals α, β, γ, δ from the two lower order bits A0c and A1c of the head address.

In FIG. 14 the two lower order bits correspond to the memory array which is accessed consecutively in a serial manner in FIG. 7, specifically, to the signals ΦA, ΦB, φC, ΦD. The memory cell array from which the serial access is commenced and the state of the basic clock signals at that time determine the method of connecting the signals ΦA, ΦB, ΦC, ΦD and the basic clock signals Φ1, Φ2, Φ3, Φ4. Accordingly, the circuit which produces the selection signals in FIG. 14 from the head addresses is essential. This has been discussed previously.

In the circuit shown in FIG. 14, when the address signal for the head address is fetched, a control signal S is temporarily set at the "H" level, and, according to the state of the address, one of the signals α, β, γ, δ temporarily enters the "H" level. Any of the signals A to D can enter the "H" level, depending on this signal. From the circuit configuration shown in FIG. 13(a), the reason for the latching of the output Xi is because the signals Φ, β, γ, δ corresponding to the signals x1 to x4, only enter the "H" level temporarily, so even when this cycle has elapsed the state of the signals A to D is maintained.

As explained above, if the signals ΦA, ΦB, ΦC, ΦD are produced from the basic clock signals, the phase relationship of the internal control becomes fixed without any relation to the head address.

Figure 15:
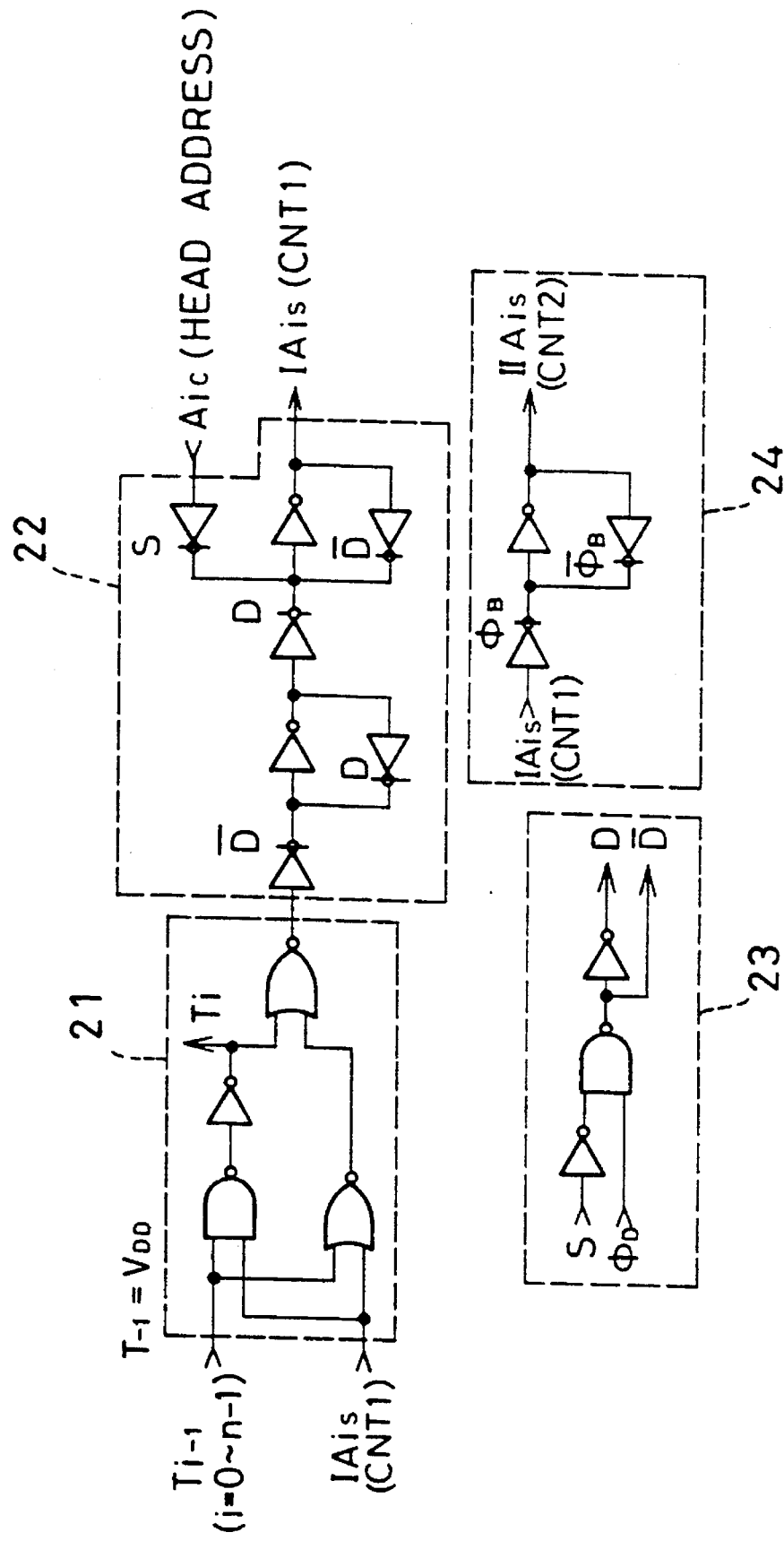
FIG. 15 is a configuration diagram showing a counter circuit for use in serial access.

Next, an example of the configuration of a counter circuit included in the specification section 13 for use in serial access, is shown in FIG. 15

The counter of FIG. 15 comprises a half-adder circuit 21 and a latch circuit 22. In addition to these components, a control circuit 23 for setting the head address in the counter, and a latch circuit 24 for the signal CNT2 which is the input to the column decoder 5 shown in FIG. 7 are also provided. The half-adder circuit 21 and the latch circuits 22, 24 contain only the number of bits required for the column address.

The address which hold the output of the half-adder circuit 21 in the form of bits is the input address (the address holding IAis in the form of bits ) +1. This is apparent from the fact that the carry input $T_{-1}$ for the lowest order bit 1=0 is at "H" level for $V_{DD}$. The latch circuit 22 and the control circuit 23 latch and output this incremented output in a suitable time period.

When the signal D rises, the output from the half adder circuit 21 is output to the latch circuit 22 as IAis, which is the address bit of the signal CNT1. Next, the address remains latched in this state until the signal D rises once again.

The control circuit 23 controls so that the column address is output from the latch circuit 22 as the signal CNT1 without the signal D being transmitted to the latch circuit 22 when the head address is set in the counter.

The address bit IAis of the signal CNT1 is delayed and is output to the latch circuit 24 as the address bit of the signal CNT2 at the rise of the signal ΦB. The address remains latched in this state until the signal ΦB rises once gain. The signals CNT1, CNT2 shown in FIG. 9, are obtained with this type of circuit configuration.

Next, a semiconductor memory device as a third embodiment of the present invention will be explained. The semiconductor memory device is a package transfer type memory device which is capable of transferring data into or from a fixed number of memory cells at a time by using a serial register.

FIG. 16 shows a block diagram of the semiconductor memory device of the package transfer type as the third embodiment to which the memory I/O operation control method according to the present invention is applied. Between memory cell groups 162 and a data I/O (input/output) section 164, a serial register section 167 comprising a plurality of serial registers (the number of the serial registers is eight in the memory device shown in FIG. 16) is incorporated in a memory device 161. A data transfer operation between the memory cell groups 162 and the data I/O section 164 is performed through the eight serial registers at a time.

A data transfer operation between the serial register section 167 and the data I/O section 164 is performed per serial register based on the period of the external basic clock signal. A data transfer control section 168 controls two types of the data transfer operations mentioned above. In the configuration of the memory device 161 shown in FIG. 16, eight bit data is transferred at once between the memory cell groups 162 and the serial register section 167. The eight bit data is seriously transferred by one bit between the data I/O section 164 and the serial register section 167.

FIG. 17 is a timing chart showing an operation of the semiconductor memory device of the package transfer type shown in FIG. 16. In the same diagram, after the CE signal becomes L level, the counting operation of the basic clock signal CLK starts from a particular cycle which is determined by a control signal provided from an external section.

In this embodiment, the particular cycle is designated by the CLK 1 at which a row address is fetched, then a column address is fetched at the CLK 3, CLK 11, and CLK 19. The column address means a head address of the target memory cells of 8 bits as a package memory cell to be fetched at once.

The difference between the prescribed interleave type memory device and the memory device of this embodiment is explained as follows:

In the latter, the setting of head addresses in target package memory cells to be fetched, each of which comprises a fixed number of memory cells to be fetched at once, cannot be determined freely a head cycle in the clock cycles required for transferring all bits in one package memory cell to be transferred at once is determined previously in the cycles at intervals of cycles determined by the number of bits in one package memory cell. Further, in the latter, in order to continue the serial access operation, a next column address must be provided after the number of clock cycles required for transferring the bits as the package data is passed. This next column head address may be generated by a counter in the chip automatically to continue the serial access operation. In FIG. 17 Dout designates a serial access operation for data output. In this case, the data output operation starts at the CLK 8.

On the other hand, Din denotes the serial access operation for data input to the memory cell groups 162. In this case, the data input operation starts at the CLK 1. Namely, in this embodiment, a memory cell group to be stored data can be determined during the data input operation to the serial register section 167, then all data in the serial register section 167 can be transferred as a packaged data to the memory cell group at once.

FIG. 18 is a block diagram of a construction circuit of a memory device as a fourth embodiment according to the present invention, which is required to perform a consecutive serial access operation by counting the number of cycles of the basic clock signal through a serial register section comprising a predetermined number of bits. In the same diagram, a specification section, for specifying a memory cell group 182, comprises a row specification section 183 and a column specification section 181. A plurality of column are selected at once as a package memory cell section by the column specification section 181. For example, each character ①, or ②, ③ in the memory cell group 182 designates a memory cell section comprising a constant number of memory cells having a consecutive address. All of the contents of the memory cells in each memory cell section ①, ②, or ③ are transferred at a time to the serial register sections 187 or 188.

The reason why there are two register sections 187 and 188 as the serial register section Is that as shown in FIG. 17, a serial access operation for bit data having the number of bits more than that of bit data for the package transfer operation. In this case, when the read-out operation is performed, cell data according to a column address CA which is read out at the CLK 3 under the control of a counting section 185 and a control section 188, for example a package data comprising all of the cell data stored in the memory cell section ① is transferred at a time to the serial register section 187.

A column address is fetched, and then, for example package data corresponding this column address comprising all of the cell data stored In the memory cell section ③ is transferred to the serial register section 188 during the package data of the memory cell section ① is accessed. Next, output of the last data in the serial register section 187 is completed, data in the serial register section 188 is accessed serially. Thus, the control section 186 controls the data I/O operations between the memory cell group 182 and the serial register sections 187, 188, and the serial register section 187, 188 and the data I/O section 184. By repeating the operations described above, serial access operation can be carried out.

On the other hand, in the case of the write-in operation, for example, sequential data is written into the serial register section 187 in accordance with the basic clock signal. In the case of the clock timing shown in FIG. 17, first the counting of the number of the clock signal CLK1 and the data write-in operation start.

The head address CA in the memory cells in the memory cell section to be stored is fetched during the period data is provided the serial register section 187 (at CLK 3).

After the cycle of the clock signal CLK of the number of the registers constituting the serial register section 187 has elapsed, data is fetched into the serial register section 188, then the package data in the serial register section 187 is transferred into the memory cell section ①, which is addressed by the column address CA, in the memory cell group 182. Next, the package data in the serial register section 188 is also transferred into the memory cell section. Thereby, the consecutive serial operation progresses.

As shown by the character Din in FIG. 17, there is a case that the data in one serial register section must be transferred into one memory cell section before data transfer operation for all of the registers in the serial register section is completed. In addition, as shown in FIG. 19, there is also a case that data must not be transferred into one register on a serial register section under the control of an input enable signal.

As shown in a timing chart of FIG. 19, data cannot be transferred into a register in the clock signal CLK when $\overline{WE}$ is in the H-level. In these cases, the contents of the register are indefinite. When package data including the indefinite data is transferred into a memory cell section, a data transfer operation cannot be completed correctly. This problem is solved by a circuit of a serial register section in the semiconductor memory device as a fifth embodiment according to the present invention shown in FIG. 20.

FIG. 20 is a block diagram showing the construction of the serial register section in a semiconductor memory device of the fifth embodiment according to the present invention.

As shown in FIG. 20, a register gate section 205 is incorporated between a serial register section 206 and a data bus 201. The register gate section 205 comprises many gates which corresponds one-to-one to the registers in the serial register section 206.

The register gate section 205 is activated when a write signal 209 is applied, then each register gate in the register gate section 205 enter ON state by a write enable signal 207 provided from the control section 203. Each register gate in ON state is corresponding to the serial register having an effective data to be transferred into a memory cell in a memory cell group. Thereby, a data transfer path between the serial register having the effective data and the data bus 201 is open. On the other hand, a data transfer path between a serial register having ineffective data and the data bus 201 is closed.

The write enable signal is, for example, produced based on a state of the $\overline{WE}$ signal by a control section 208 Thus, the content of a memory cell can be kept correctly because disabling the transfer of the data in a register having ineffective data the memory cell can be protected by a register gate when a package transfer operation is performed.

On the other hand, in the read-out operation, a package data stored in a memory cell section is transferred to a serial register section 206 through the data bus 202. In this case, the register gate section 205 is not activated.

With a control system of this type and memory device with this configuration, access can be made without the necessity for critical timing and without using a large number of control signals by using the high speed mode state. Because of this fact, it can be clearly understood that all operations can be controlled with a high speed serial clock signal CLK, and controls easily performed. In addition, because interleaving can be carried out with any of these clock signals in the internal operation, the internal operations can be performed by doubling the number of high speed access cycles. No special circuit technology is required to convert to high speed.

In addition, the phase of the access of the internal circuit section operation is fixed without depending on accessing the head address. Accordingly, restrictions relating to the head address disappear.

Furthermore, no special circuit is required to convert high speed because by the present invention the package transfer method, by which an internal operation in a semiconductor memory device can be performed every plural cycles of a clock signal, can be applied to the semiconductor memory device.

Various modification will become possible for those skilled in the art after receiving the teachings of the present disclosure without departing from the scope thereof.

What is claimed is:

1. A semiconductor memory device, comprising:
    a memory cell array having a plurality of memory cells arranged in rows and columns, said memory cells storing data and being selected according to address signals; and
    control means, receiving a clock signal and a first control signal, for outputting a plurality of said data in synchronism with said clock signal after said first control signal is asserted, output of said data beginning a number of clock cycles (N) of said clock signal (N being a positive integer $\geq 2$) after said first control signal is asserted, a different one of said data being output at each of said clock cycles after said output begins until said plurality of data is output.

2. A semiconductor memory device according to claim 1, wherein said control means receives said address signals on a transition of said clock signal after said first control signal is asserted.

3. A semiconductor memory device according to claim 1, wherein said control means further receives row address signals for selecting said memory cells and a second control signal, said control means receiving said row address signals on a transition of said clock signal after said second control signal is asserted.

4. A semiconductor memory device according to claim 1, wherein said control means further comprises count means for counting said number of cycles of said clock signal.

5. A semiconductor memory device according to claim 1, wherein said first control signal is a pulse signal.

6. A semiconductor memory device comprising:
    a memory cell array having a plurality of memory cells arranged in rows and columns, said memory cells being selected based on an address signal; and
    control means for receiving a first signal having a first state and a second state, and a second signal having a third state and a fourth state, and for outputting a plurality of data stored in said memory cells in synchronism with said first signal, after said first signal switches N times (N $\geq 2$, N is a positive integer) from the first state to the second state after said second signal switches from said third state to said fourth state.

7. A semiconductor memory device according to claim 6, wherein said control means receives said address signal when said first signal switches from said first state to said second state after said second signal switches from said third state to said fourth state.

8. A semiconductor memory device according to claim 6, wherein said control means further receives an address signal used to select said memory cells and receives a third signal having a fifth state and a sixth state, said control means receives said address signal when said first signal switches from said first state to said second state after said third signal switches from said fifth state to said sixth state.

9. A semiconductor memory device according to claim 8, wherein said address signal is a row address signal.

10. A semiconductor memory device according to claim 6, wherein said control means further receives a column address signal when said second signal switches from said third state to said fourth state.

11. A semiconductor memory device according to claim 6, wherein said control means comprises count means for counting a number of times said first signal switches from said first state to said second state.

12. A semiconductor memory device according to claim 6, wherein said second signal is a pulse signal.

13. A semiconductor memory device according to claim 6, wherein a period of said first signal is from about 10 nano seconds to about 15 nano seconds.

14. A semiconductor memory device according to claim 6, wherein said control means further receives a fifth signal having a ninth state and a tenth state, and said control means delays the output of said plurality of data based on a number of switches of said first signal counted while said fifth signal is in said tenth state.

15. A semiconductor memory device according to claim 6, wherein said control means further receives a fifth signal having a ninth state and a tenth state, and said control means negates the first signal counted while said fifth signal is in said tenth state.

16. A semiconductor memory device according to claim 6, wherein said control means further receives a fourth signal having a seventh state and an eighth state and a fifth signal having an eleventh state and a twelfth state, and said control means receives said fourth signal when the first signal changes from said first state to said second state while said fifth signal is in said twelfth state.

17. A semiconductor memory device according to claim 6, wherein the first state of said first signal is a low level.

18. A semiconductor memory device according to claim 6, wherein the third state of said second signal is a high level.

19. A semiconductor memory device according to claim 8, wherein the fifth state of said third signal is a low level.

20. A semiconductor memory device according to claim 21, wherein the third state of said second signal is a low level.

21. A semiconductor memory device according to claim 14, wherein the ninth state of said fifth signal is a low level.

22. A semiconductor memory device, comprising:
    a memory cell group comprising a plurality of memory cells grouped into a plurality of cell blocks arranged in a column;
    specification means for specifying and concurrently activating a fixed number of memory cell addresses by sequential addresses in said memory cells in accordance with a basic clock signal and an address signal provided from an external section;
    store means for temporarily storing data from or to the fixed number of memory cells specified at the same time by said specification means;
    control means for carrying out a data transfer operation between the fixed number of the memory cells specified by said specification means and said store means in accordance with the basic clock signal and one or more specification signals provided from an external section;
    data input/output (I/O) means for executing sequentially a data read-out/write-in operation for said store means in accordance with the basic clock signal; and
    count means for counting the number of cycles in response to a basic clock signal:
        wherein said control means receives at least two of said specification signals provided from an external section,
    outputs a control signal per each specification signal for specifying a particular cycle as a starting cycle to count the number of cycles in response to the basic clock signal;

instructs the count means to count the number of cycles in response to the basic clock signal based on the control signal, controls a specification operation executed by the specification means and the data I/O operation of the data I/O means based on the counted number of cycles of at least two counted from the particular cycle by the count means in accordance with the number of cycles in response to the basic clock signal.

23. A semiconductor memory device according to claim 22, wherein under the control of the control means a fetch operation for data in an x-th memory cell block (x=i−m (mod n), module n) is started before m cycles counted from a starting cycle of the basic clock signal to access the i-th memory cell block and output the contents of the x-th memory cell block when consecutive data are fetched from the n (n ≧2) memory cell blocks.

24. A semiconductor memory device according to claim 22, wherein the selection means provides a plurality of internal basic clock signals, differing only in phase from said basic clock signal, the plurality of said memory cell blocks being selected and activated in a fixed order by using the internal basic clock signals and a part of an address signal for specifying a head memory cell block to be accessed, whatever the state of the internal basic clock signal when said head memory cell block is specified.

25. A semiconductor memory device according to claim 22, wherein said memory cell group includes n memory cells blocks, said n memory cell blocks being grouped into N (n>N) large memory cell blocks, each large memory cell block including k (n>k) memory cell blocks (n=N ×k), a column decoder for each large memory cell block, said k memory cell blocks in each large memory cell block being controlled by the same column decoder, each column decoder being activated at least once in n cycles of the basic clock signal for specifying consecutively said memory cells in said k memory cell blocks under the control of said specification means, and said column decoder being provided for each large memory cell block keeping a large memory cell block specified during at least the next k cycles of the basic clock signal.

* * * * *